US009704424B2

(12) United States Patent
Sun (10) Patent No.: US 9,704,424 B2
(45) Date of Patent: Jul. 11, 2017

(54) ARRAY SUBSTRATE AND DISPLAY DEVICE (71) Applicant: BOE TECHNOLOGY GROUP CO., LTD., Beijing (CN)

(72) Inventor: Tuo Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 93 days.

(21) Appl. No.: 14/437,107

(22) PCT Filed: Aug. 29, 2014

(86) PCT No.: PCT/CN2014/085512
§ 371 (c)(1),
(2) Date: Apr. 20, 2015

(87) PCT Pub. No.: WO2015/149476
PCT Pub. Date: Oct. 8, 2015

(65) Prior Publication Data
US 2016/0275838 A1   Sep. 22, 2016

(30) Foreign Application Priority Data
Apr. 1, 2014  (CN) .......................... 2014 1 0128978

(51) Int. Cl.
G09G 3/20   (2006.01)
G02F 1/1362  (2006.01)
(Continued)

(52) U.S. Cl.
CPC ............. *G09G 3/20* (2013.01); *G02F 1/1362* (2013.01); *G09G 3/2003* (2013.01);
(Continued)

(58) Field of Classification Search
CPC ...... G09G 3/20; G09G 3/3607; G09G 3/3659; G09G 3/3648; G09G 3/3208;
(Continued)

(56) References Cited

U.S. PATENT DOCUMENTS 8,023,089 B2 *  9/2011  Yeh ...................... G09G 3/3648
345/103
2006/0132668 A1 *  6/2006  Park ..................... G09G 3/3233
349/48
(Continued)

FOREIGN PATENT DOCUMENTS

CN   1963609 A    5/2007
CN   101285950 A  10/2008
(Continued)

OTHER PUBLICATIONS

CN203038924U to Zhou Gao—English Language Translation; published: Jul. 3, 2013.*
(Continued)

*Primary Examiner* — Nalini Mummalaneni
(74) *Attorney, Agent, or Firm* — Kinney & Lang, P.A.

(57) ABSTRACT

The disclosure relates to a field of display technology and discloses an array substrate and a display device, which improves quality of a displaying picture of a display device. The array substrate includes a plurality of pixel units arranged in an array, sub-pixels of each pixel unit are arranged in an ACBC-type array or a Delta-type array. The array substrate further includes a set of data lines configured to output data signals to the sub-pixels of the plurality of pixel units, the set of data lines each drives the sub-pixels of the same color. Compared with the prior art, the technical solution of the present disclosure avoids displaying errors caused by different corresponding relationship curves between the data output signals and the pixel grey levels for different colors, thereby improving quality of a displaying picture of a display device including the array substrate.

7 Claims, 4 Drawing Sheets (51) Int. Cl.
*H01L 27/32* (2006.01)
*G09G 3/3208* (2016.01)

(52) U.S. Cl.
CPC ...... *H01L 27/3218* (2013.01); *G02F 2201/52* (2013.01); *G09G 3/3208* (2013.01); *G09G 2300/0408* (2013.01); *G09G 2300/0426* (2013.01); *G09G 2300/0452* (2013.01); *G09G 2320/0242* (2013.01); *G09G 2320/0666* (2013.01)

(58) Field of Classification Search
CPC ......... G09G 3/2003; G09G 2300/0408; G09G 2300/0426; G09G 2300/0452; G09G 2300/0242; G09G 2300/0666; G02F 1/1362; G02F 2201/52; H01L 27/3218
See application file for complete search history.

(56) References Cited

U.S. PATENT DOCUMENTS

2008/0290794 A1* 11/2008 Yuasa .................. G09G 3/3225
                                                    313/504

| | | | |
|---|---|---|---|
| 2011/0149215 A1 | | 6/2011 | Shimizu et al. |
| 2011/0299003 A1 | | 12/2011 | Arasawa et al. |

FOREIGN PATENT DOCUMENTS

| | | | |
|---|---|---|---|
| CN | 102654701 A | | 9/2012 |
| CN | 103226230 A | | 7/2013 |
| CN | 203038924 U | * | 7/2013 |
| CN | 103325315 A | | 9/2013 |
| CN | 203365857 U | | 12/2013 |
| CN | 103943032 A | | 7/2014 |
| JP | 2006235647 A | | 9/2006 |

OTHER PUBLICATIONS

International Search Report and Written Opinion dated Dec. 17, 2014, for PCT Application No. PCT/CN2014/085512.
International Search Report and Written Opinion in Chinese dated Dec. 17, 2014, for PCT Application No. PCT/CN2014/085512.
First Office Action with Search Report for corresponding CN Application No. 201410128978.6, dated Sep. 14, 2015, 6 pages.

* cited by examiner

ARRAY SUBSTRATE AND DISPLAY DEVICE

FIELD OF THE INVENTION

The present disclosure relates to field of display, and particularly, to an array substrate and a display device.

DESCRIPTION OF THE RELATED ART

An array substrate of a flat panel display device includes a plurality of pixel units arranged in an array, in which each of the pixel units includes two or three sub-pixels corresponding to different colors and each sub-pixel is provided with a thin film transistor switch element. A gate electrode of the thin film transistor switch element is coupled to a gate drive module via a gate line while a source electrode of the same is coupled to a data drive module via a data line.

Common arrangement manners of the sub-pixels of an array substrate include an ACBC-type array (each pixel unit includes two sub-pixels of different colors and the sub-pixels of every two adjacent pixel units are arranged in an ACBC-type array) and a Delta-type array (each pixel unit includes three triangularly-arranged sub-pixels of different colors). In these two types of array substrates, the sub-pixels of different colors are staggered to one another and each data line synchronously drives sub-pixels of two or more colors.

The array substrate in prior art has disadvantage that: as corresponding relationship curves between the output data signals and the pixel grey levels are not identical for the sub-pixels of different colors, synchronous drive of the sub-pixels of two or more colors by the same data line in prior art causes displaying errors, thereby degrading quality of the displaying picture.

SUMMARY OF THE DISCLOSURE

It is provided an array substrate and a display device according to embodiments of the present disclosure, which improves quality of a displaying picture of a display device.

According to an aspect of embodiments of the present disclosure, there is provided an array substrate, comprising:

a plurality of pixel units arranged in an array, each of the plurality of pixel units comprising two sub-pixels of different colors and sub-pixels in every two adjacent pixel units being arranged in an ACBC-type array; and a set of data lines configured to output data signals to the sub-pixels of the plurality of pixel units, the set of data lines each driving the sub-pixels of the same color.

In this technical solution of the present disclosure, as each data line drives the sub-pixels of the same color, displaying errors caused by different corresponding relationship curves between the data output signals and the pixel grey levels for different colors in the prior art are avoided, thereby improving quality of a displaying picture of a display device including the array substrate.

In an alternative embodiment of the present disclosure, the array substrate has a pixel resolution of $2m \times 2n$, and the set of data lines includes $4n+2$ data lines, wherein the data signals outputted by the $4n+2$ data lines to the sub-pixels of the plurality of pixel units are respectively as below:

wherein m and n are natural number, and, a first data line outputs a data signal of $(0\ B_2^1\ 0\ B_4^1 \ldots 0\ B_{2m-2}^1\ 0\ B_{2m}^1)$, a second data line outputs a data signal of $(0\ C_2^1\ 0\ C_4^1 \ldots C_{2m-2}^1\ 0\ C_{2m}^1)$, a last but one data line outputs a data signal of $(B_1^{2n}\ 0\ B_3^{2n}\ 0 \ldots B_{2m-3}^{2n}\ 0\ B_{2m-1}^{2n}\ 0)$, and a last data line outputs a data signal of $(C_1^{2n}\ 0\ C_3^{2n}\ 0 \ldots C_{2m-3}^{2n}\ 0\ C_{2m-1}^{2n}\ 0)$.

In this technical solution, each data line drives the sub-pixels of the same color and each of the sub-pixels can be driven.

In an alternative embodiment of the present disclosure, the array substrate comprises a thin film transistor array substrate or an organic light-emitting diode array substrate.

In an alternative embodiment of the present disclosure, the array substrate comprises an organic light-emitting diode array substrate; the sub-pixels of the plurality of pixel units of the organic light-emitting diode array substrate are arranged obliquely and the sub-pixels in the same oblique line direction are of the same color.

In this technical solution, layout of the array substrate is optimized, and the sub-pixels of the same color are arranged in the same oblique line direction, which greatly simplifies manufacture process of a light-emitting diode array substrate and reduces cost of producing a mask plate.

Further, an oblique angle is 45 degree, which further optimizes the layout of the array substrate.

According to another aspect of embodiments of the present disclosure, there is provided an array substrate, which is a Delta-type array substrate, the array substrate comprising:

a plurality of pixel units arranged in an array, each of the pixel units comprising three triangularly-arranged sub-pixels of different colors; and a set of data lines configured to output data signals to sub-pixels of the plurality of pixel units, each of the data lines driving the sub-pixels of the same color.

In the same way, as each data line drives the sub-pixels of the same color, displaying errors caused by different corresponding relationship curves between the data output signals and the pixel grey levels for the sub-pixels of different colors in the prior art are avoided, thereby improving quality of a displaying picture of a display device including the array substrate.

In an alternative embodiment of the present disclosure, the array substrate has a pixel resolution of $m \times n$, and the set of data lines includes $3n+1$ data lines, wherein data signals outputted by the $3n+1$ data lines to the sub-pixels of the plurality of pixel units are respectively as below:

$$\begin{pmatrix} 0 & 0 & A_1^1 & C_1^1 & B_1^2 & C_1^2 & & B_1^{2n-2} & C_1^{2n-2} & A_1^{2n-1} & C_1^{2n-1} & B_1^{2n} & C_1^{2n} \\ B_2^1 & C_2^1 & A_2^2 & C_2^2 & B_2^3 & C_2^3 & \cdots & B_2^{2n-1} & C_2^{2n-1} & A_2^{2n} & C_2^{2n} & 0 & 0 \\ & & \vdots & & & & \ddots & & & \vdots & & & \\ 0 & 0 & A_{2m-1}^1 & C_{2m-1}^1 & B_{2m-1}^2 & C_{2m-1}^2 & & B_{2m-1}^{2n-2} & C_{2m-1}^{2n-2} & A_{2m-1}^{2n-1} & C_{2m-1}^{2n-1} & B_{2m-1}^{2n} & C_{2m-1}^{2n} \\ B_{2m}^1 & C_{2m}^1 & A_{2m}^2 & C_{2m}^2 & B_{2m}^3 & C_{2m}^3 & \cdots & B_{2m}^{2n-1} & C_{2m}^{2n-1} & A_{2m}^{2n} & C_{2m}^{2n} & 0 & 0 \end{pmatrix},$$

$$\begin{pmatrix} R_1^1 & G_1^1 & B_1^1 & R_1^2 & G_1^2 & B_1^2 & R_1^3 & & R_1^{n-1} & G_1^{n-1} & B_1^{n-1} & R_1^n & G_1^n & B_1^n & 0 \\ 0 & G_2^1 & B_2^1 & R_2^2 & G_2^2 & B_2^2 & R_2^2 & \cdots & R_2^{n-2} & G_2^{n-1} & B_2^{n-1} & R_2^{n-1} & G_2^n & B_2^n & R_2^n \\ R_3^1 & G_3^1 & B_3^1 & R_3^2 & G_3^2 & B_3^2 & R_3^3 & & R_3^{n-1} & G_3^{n-1} & B_3^{n-1} & R_3^n & G_3^n & B_3^n & 0 \\ & & & & \vdots & & & \ddots & & & \vdots & & & & \\ 0 & G_{m-2}^1 & B_{m-2}^1 & R_{m-2}^1 & G_{m-2}^2 & B_{m-2}^2 & R_{m-2}^3 & & R_{m-2}^{n-2} & G_{m-2}^{n-1} & B_{m-2}^{n-1} & R_{m-2}^{n-1} & G_{m-2}^n & B_{m-2}^n & R_{m-2}^n \\ R_{m-1}^1 & G_{m-1}^1 & B_{m-1}^1 & R_{m-1}^1 & G_{m-1}^2 & B_{m-1}^2 & R_{m-1}^3 & \cdots & R_{m-1}^{n-1} & G_{m-1}^{n-1} & B_{m-1}^{n-1} & R_{m-1}^n & G_{m-1}^n & B_{m-1}^n & 0 \\ 0 & G_m^1 & B_m^1 & R_m^2 & G_m^2 & B_m^2 & R_m^3 & & R_m^{n-2} & G_m^{n-1} & B_m^{n-1} & R_m^{n-1} & G_m^n & B_m^n & R_m^n \end{pmatrix},$$

wherein, m and n are natural number, and a first data line outputs a data signal of $(R_1^1\ 0\ R_3^1\ \ldots\ 0\ R_{m-1}^1\ 0)$, and a last data line outputs a data signal of $(0\ R_2^n\ 0\ \ldots\ R_{m-2}^n\ 0\ R_m^n)$.

In this technical solution, each data line drives the sub-pixels of the same color and each of the sub-pixels may be driven.

In an alternative embodiment of the present disclosure, the array substrate comprises a thin film transistor array substrate or an organic light-emitting diode array substrate.

According to still another aspect of embodiments of the present disclosure, there is provided a display device comprising the array substrate according to any of the above-mentioned solutions, which performs a preferable quality of the displaying picture.

DETAILED DESCRIPTION OF THE PREFERRED EMBODIMENTS

In order to improve a quality of a displaying picture of a display device, an array substrate and a display device according to embodiments of the present disclosure are provided. According to the technical solution of the present disclosure, as the data lines each drives the sub-pixels of the same color, displaying errors caused by different corresponding relationship curves between the data output signals and the pixel grey levels for the sub-pixels of different colors that exist in the prior art are avoided, thereby improving quality of a displaying picture of a display device including the array substrate.

Technical solutions of the present disclosure will be described explicitly and fully hereinafter in detail by the way of embodiments with reference to figures of the attached drawings. Obviously, the described embodiments are only parts of the embodiments of the present disclosure, rather than all the embodiments. Other embodiments obtained without involving inventive labors by those skilled in the art based on the described embodiments of the present disclosure fall into the scope of the present disclosure.

Figure 1:
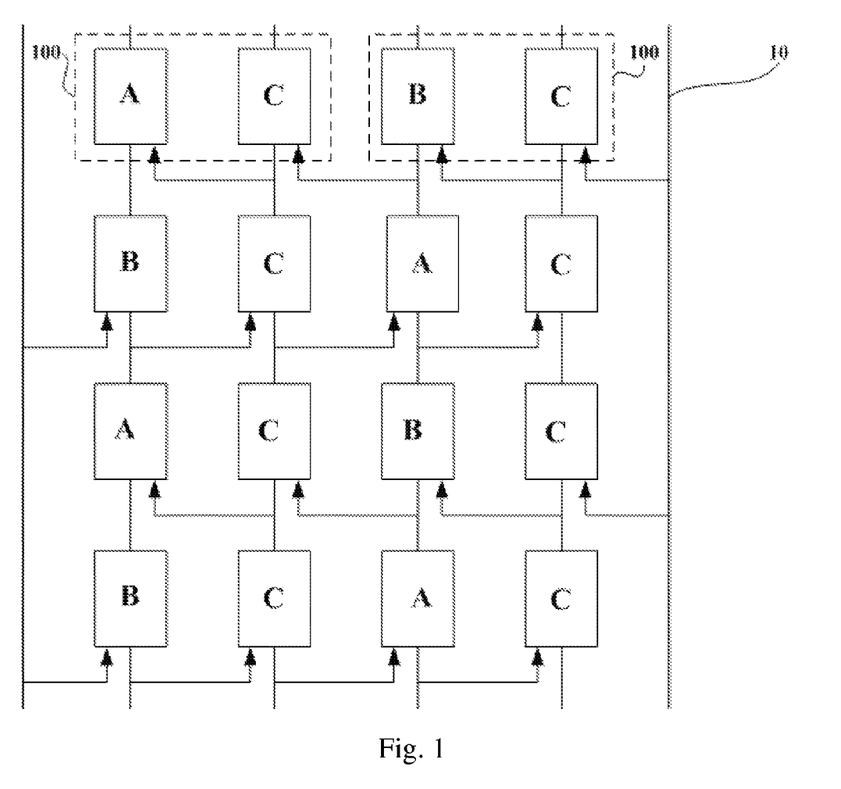
FIG. 1 is a top view of a drive circuit of an array substrate according to a first embodiment of the present disclosure.

As shown in FIG. 1, there is provided an array substrate according to an exemplary embodiment of the present disclosure, the array substrate comprising:

a plurality of pixel units 100 arranged in an array, each of the pixel units 100 comprising two sub-pixels of different colors and sub-pixels in every two adjacent pixel units 100 being arranged in ACBC-type array; and a set of data lines 10 configured to output data signals to sub-pixels of the plurality of pixel units 100, each of the data lines 10 driving the sub-pixels of the same color.

The array substrate is not limited to any specific type, and may be a thin film transistor array substrate or an organic light-emitting diode array substrate. The embodiments of the present disclosure are described by taking an organic light-emitting diode array substrate as an example. In a structure of the array substrate, data lines are located below the organic light-emitting diode and pixel electrodes of the organic light-emitting diode are coupled to the date lines via a through-hole structure. In an ACBC-type array substrate, in case that a pixel resolution is of 2m×2n (in which m and n are natural number), each pixel unit 100 includes two sub-pixels of different colors and sub-pixels of two adjacent pixel units 100 in the same row are arranged in an ACBC-type array while sub-pixels of two adjacent pixel units 100 in the same column are arranged in an ACBC-type array. A, B and C represent one of red, green and blue, respectively.

For one frame of picture, the signal outputted by the data drive module is a matrix, of which matrix elements are drive voltages corresponding to the sub-pixel grey levels. For the existing ACBC-type array substrate, the data signal outputted to sub-pixels of the 2m×2n pixel units is as below:

(equation 1)

$$\begin{pmatrix} A_1^1 & C_1^1 & B_1^2 & C_1^2 & & A_1^{2n-1} & C_1^{2n-1} & B_1^{2n} & C_1^{2n} \\ B_2^1 & C_2^1 & A_2^2 & C_2^2 & \cdots & B_2^{2n-1} & C_2^{2n-1} & A_2^{2n} & C_2^{2n} \\ & \vdots & & & \ddots & & \vdots & & \\ A_{2m-1}^1 & C_{2m-1}^1 & B_{2m-1}^2 & C_{2m-1}^2 & & A_{2m-1}^{2n-1} & C_{2m-1}^{2n-1} & B_{2m-1}^{2n} & C_{2m-1}^{2n} \\ B_{2m}^1 & C_{2m}^1 & A_{2m}^2 & C_{2m}^2 & \cdots & B_{2m}^{2n-1} & C_{2m}^{2n-1} & A_{2m}^{2n} & C_{2m}^{2n} \end{pmatrix}$$

wherein m and n are natural number.

Meanwhile, the data signal outputted from the data line by which sub-pixel A and sub-pixel B are driven is $(A_1^q\ B_2^q\ \ldots\ A_{2m-1}^q\ B_{2m}^q)$, wherein $1<q<2n$. Since corresponding relationship curves between the output data signals and the pixel grey levels are not identical for the sub-pixels of different colors, synchronous drive of the sub-pixels of two or more colors by the same data line in prior art causes displaying errors, thereby degrading quality of the displaying picture.

In the ACBC-type array substrate according to an exemplary embodiment of the present disclosure, in case that the array substrate has a pixel resolution of 2m×2n and a set of data lines includes 4n+2 data lines, data signals outputted by the 4n+2 data lines to sub-pixels of the 2m×2n pixel units are respectively as below:

$$\begin{pmatrix} 0 & 0 & A_1^1 & C_1^1 & B_1^2 & C_1^2 & & B_1^{2n-2} & C_1^{2n-2} & A_1^{2n-1} & C_1^{2n-1} & B_1^{2n} & C_1^{2n} \\ B_2^1 & C_2^1 & A_2^2 & C_2^2 & B_2^3 & C_2^3 & \cdots & B_2^{2n-1} & C_2^{2n-1} & A_2^{2n} & C_2^{2n} & 0 & 0 \\ & & & \vdots & & & \ddots & & & \vdots & & & \\ 0 & 0 & A_{2m-1}^1 & C_{2m-1}^1 & B_{2m-1}^2 & C_{2m-1}^2 & & B_{2m-1}^{2n-2} & C_{2m-1}^{2n-2} & A_{2m-1}^{2n-1} & C_{2m-1}^{2n-1} & B_{2m-1}^{2n} & C_{2m-1}^{2n} \\ B_{2m}^1 & C_{2m}^1 & A_{2m}^2 & C_{2m}^2 & B_{2m}^3 & C_{2m}^3 & \cdots & B_{2m}^{2n-1} & C_{2m}^{2n-1} & A_{2m}^{2n} & C_{2m}^{2n} & 0 & 0 \end{pmatrix}$$ (equation 2)

Wherein, m and n are natural number.

In this way, each data line drives sub-pixels of the same color and each of the sub-pixels may be driven. The data lines in this embodiment at the same position corresponding to those of the prior art outputs data signals of $(A_1^q A_2^{q+1} A_3^q A_4^{q+1} \ldots A_{2m-2}^{q+1} A_{2m-2}^q A_{2m-1}^q A_{2m}^{q+1})$. In order to ensure all sub-pixels in the foregoing two columns and the last two columns to be driven normally, a first data line outputs a data signal of $(0\ B_2^1\ 0\ B_4^1 \ldots 0\ B_{2m-2}^1\ 0\ B_{2m}^1)$, a second data line outputs a data signal of $(0\ C_2^1\ 0\ C_4^1 \ldots 0\ C_{2m-2}^1\ 0\ C_{2m}^1)$, a last but one data line outputs a data signal of $(B_1^{2n}\ 0\ B_3^{2n}\ 0 \ldots B_{2m-3}^{2n}\ 0\ B_{2m-1}^{2n}\ 0)$, and a last data line outputs a data signal of $(C_1^{2n}\ 0\ C_3^{2n}\ 0 \ldots C_{2m-3}^{2n}\ 0\ C_{2m-1}^{2n}\ 0)$. The forgoing two data lines and the last two data lines output 0 grey levels for the sub-pixels that may be driven normally. Compared with the equation 1 in prior art, equation 2 has two 0 grey levels to be inserted in head ends of odd-numbered rows and two 0 grey levels to be inserted in terminal ends of even-numbered rows.

It is noted that, in the abovementioned data signals outputted by the 4n+2 data lines to the sub-pixels of the 2m×2n pixel units, A, B and C may represent one of red, green and blue, respectively. In other words, A may be red, green or blue.

Figure 2:
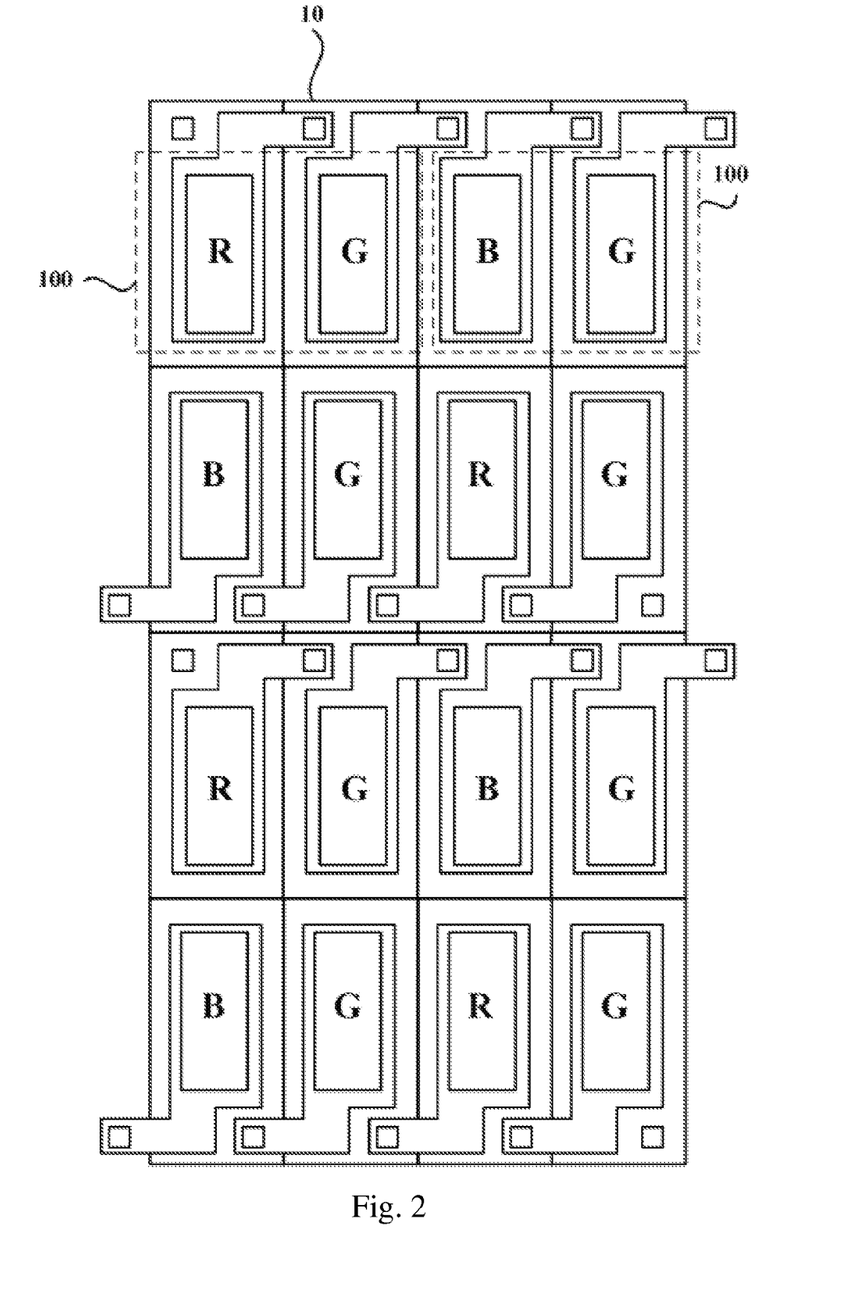
FIG. 2 is a schematic structural top view of an array substrate according to a second embodiment of the present disclosure.
Figure 3:
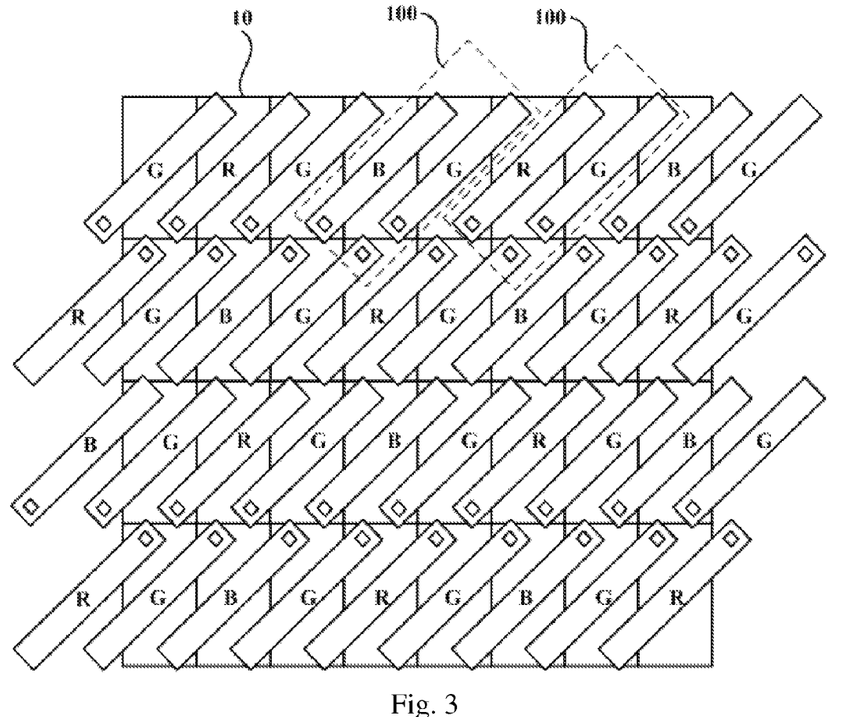
FIG. 3 is a schematic structural top view of an array substrate according to a third embodiment of the present disclosure.

Manner of the arrangement of the sub-pixel of the plurality of pixel units 100 in the array substrate is not limited to this. For example, as shown in FIG. 2, a length side and a width side of the pixel unit 100 are respectively paralleled to the data line 10 and the gate line (which is not shown in FIG. 2). As shown in FIG. 3 where the array substrate is an organic light-emitting diode array substrate, sub-pixels of the plurality of pixel units 100 of the organic light-emitting diode array substrate are preferably arranged obliquely and the sub-pixels in the same oblique line direction are of the same color. In this way, layout of the array substrate is optimized, and the sub-pixels of the same color are arranged in the same oblique line direction such that a pattern of a mask plate may be fabricated to be a strip-shape (which is a point-shape in prior art), thereby greatly simplifying manufacture process of a light-emitting diode array substrate and reducing cost of producing a mask plate. In FIG. 3, the oblique angle of the sub-pixels is 45 degree, which further optimizes the layout of the array substrate.

Figure 4:
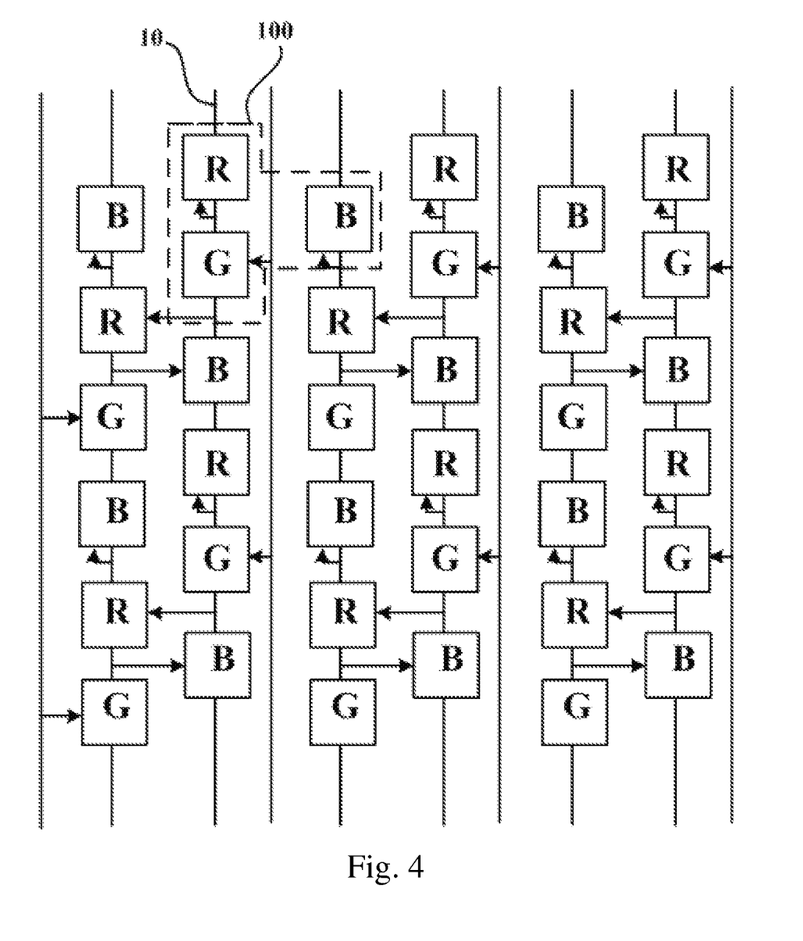
FIG. 4 is a top view of a drive circuit of an array substrate according to a fourth embodiment of the present disclosure.

FIG. 4 illustrates an array substrate according to another embodiment of the present disclosure. The array substrate is a Delta-type array substrate and includes:

a plurality of pixel units 100 arranged in an array, each of the pixel units comprising three triangularly-arranged sub-pixels of different colors; and a set of data lines 10 configured to output data signals to sub-pixels of the plurality of pixel units 100, each of the data lines driving the sub-pixels of the same color.

The type of the Delta-type array substrate as shown in FIG. 4 is not limited to this and may be, such as, a thin film transistor array substrate or an organic light-emitting diode array substrate.

In the Delta-type array substrate, in case that the array substrate has a pixel resolution of m×n (in which m and n are natural number), each of the pixel units 100 includes three triangularly-arranged sub-pixels of different colors, i.e., a red sub-pixel, a green sub-pixel and a blue sub-pixel.

In a Delta-type array substrate in prior art, a data signal outputted to the sub-pixel of the m×n pixel units is as follow:

$$\begin{pmatrix} R_1^1 & G_1^1 & B_1^1 & & R_1^n & G_1^n & B_1^n \\ B_2^1 & G_2^1 & R_2^1 & \cdots & B_2^n & G_2^n & R_2^n \\ R_3^1 & G_3^1 & B_3^1 & & R_3^n & G_3^n & B_3^n \\ & \vdots & & \ddots & & \vdots & \\ B_{m-2}^1 & G_{m-2}^1 & R_{m-2}^1 & & B_{m-2}^n & G_{m-2}^n & R_{m-2}^n \\ R_{m-1}^1 & G_{m-1}^1 & B_{m-1}^1 & \cdots & R_{m-1}^n & G_{m-1}^n & B_{m-1}^n \\ B_m^1 & G_m^1 & R_m^1 & & B_m^n & G_m^n & R_m^n \end{pmatrix}$$ (equation 3)

wherein m and n are natural number.

The data signal outputted from the data line that synchronously drives red sub-pixel and blue sub-pixel is $(R_1^p B_2^p \ldots R_{m-1}^p B_m^p)$, wherein $1<q<n$. Since corresponding relationship curves between the output data signals and the pixel grey levels are not identical for the sub-pixels of different colors, synchronous drive of the sub-pixels of two or more colors by the same data line in prior art causes displaying errors, thereby degrading quality of the displaying picture.

In the Delta-type array substrate according to an exemplary embodiment of the present disclosure, in case that the array substrate has a pixel resolution of m×n and the set of data lines includes 3n+1 data lines, data signals outputted by the 3n+1 data lines to sub-pixels of the m×n pixel units are respectively as below:

$$\begin{pmatrix} R_1^1 & G_1^1 & B_1^1 & R_1^2 & G_1^2 & B_1^2 & R_1^3 & & R_1^{n-1} & G_1^{n-1} & B_1^{n-1} & R_1^n & G_1^n & B_1^n & 0 \\ 0 & G_2^1 & B_2^1 & R_2^1 & G_2^2 & B_2^2 & R_2^2 & & R_2^{n-2} & G_2^{n-1} & B_2^{n-1} & R_2^{n-1} & G_2^n & B_2^n & R_2^n \\ R_3^1 & G_3^1 & B_3^1 & R_3^2 & G_3^2 & B_3^2 & R_3^3 & \cdots & R_3^{n-1} & G_3^{n-1} & B_3^{n-1} & R_3^n & G_3^n & B_3^n & 0 \\ & & & & \vdots & & & \ddots & & & & \vdots & & & \\ 0 & G_{m-2}^1 & B_{m-2}^1 & R_{m-2}^1 & G_{m-2}^2 & B_{m-2}^2 & R_{m-2}^3 & & R_{m-2}^{n-2} & G_{m-2}^{n-1} & B_{m-2}^{n-1} & R_{m-2}^{n-1} & G_{m-2}^n & B_{m-2}^n & R_{m-2}^n \\ R_{m-1}^1 & G_{m-1}^1 & B_{m-1}^1 & R_{m-1}^1 & G_{m-1}^2 & B_{m-1}^2 & R_{m-1}^3 & \cdots & R_{m-1}^{n-1} & G_{m-1}^{n-1} & B_{m-1}^{n-1} & R_{m-1}^n & G_{m-1}^n & B_{m-1}^n & 0 \\ 0 & G_m^1 & B_m^1 & R_m^2 & G_m^2 & B_m^2 & R_m^3 & & R_m^{n-2} & G_m^{n-1} & B_m^{n-1} & R_m^{n-1} & G_m^n & B_m^n & R_m^n \end{pmatrix}$$ (equation 4)

wherein m and n are natural number.

In this way, the data lines each drives sub-pixels of the same color and each of the sub-pixels may be driven. In order to ensure all sub-pixels in the foregoing column and the last column to be driven normally, a first data line outputs a data signal of $(R_1^1\ 0\ R_3^1\ \ldots\ 0\ R_{m-1}^1\ 0)$ and a last data line outputs a data signal of $(0\ R_2^n\ 0\ \ldots\ R_{m-2}^n\ 0\ R_m^n)$. The forgoing data line and the last data line output 0 grey levels for the sub-pixels that may be driven normally. Compared with equation 3 in prior art, equation 4 has one 0 grey level to be inserted in head ends of odd-numbered rows and one 0 grey level to be inserted in terminal ends of even-numbered rows.

It is noted that, in the abovementioned description, R, G and B respectively represent red sub-pixel, green sub-pixel and blue sub-pixel. However, the abovementioned equation 4 is not limited to respectively represent the red sub-pixel, the green sub-pixel and the blue sub-pixel by R, G and B. Instead of, R may represent one of the green sub-pixel and the blue sub-pixel, G may represent one of the red sub-pixel and the blue sub-pixel and B may represent one of the red sub-pixel and the green sub-pixel, in accordance with actual arrangement of the sub-pixels, in order to achieve a Delta-type array arrangement.

In the technical solutions according to the embodiments of the present disclosure, as the data lines each drives the sub-pixels of the same color, displaying errors caused by different corresponding relationship curves between the data output signals and the pixel grey levels for the sub-pixels of different colors in the prior art are avoided, thereby improving quality of a displaying picture of a display device including the array substrate.

According to an embodiment of an aspect of the present disclosure, there is provided a display device comprising the abovementioned ACBC-type array substrate or the triangularly-arranged array substrate. The display device performs a preferable quality of the displaying picture.

Any changes, equivalent replacement, modification within the spirit and principles of the disclosure can be made by those skilled in the art and should be fallen to the scope of the present disclosure, if these changes and modifications belong to scope of the claims of the appended claims and their equivalents.

The invention claimed is:

1. An array substrate, comprising:
a plurality of pixel units arranged in an array, each of the plurality of pixel units comprising two sub-pixels of different colors and sub-pixels in every two adjacent pixel units being arranged in an ACBC-type array; and
a set of data lines configured to output data signals to the sub-pixels of the plurality of pixel units, each of the data lines driving the sub-pixels of the same color;
wherein the array substrate has a pixel resolution of 2m×2n, and the set of data lines includes 4n+2 data lines, wherein the data signals outputted by the 4n+2 data lines to the sub-pixels of the plurality of pixel units are respectively as below:

$$\begin{pmatrix} 0 & 0 & A_1^1 & & B_1^{2n-2} & C_1^{2n-2} & A_1^{2n-1} \\ C_1^1 & B_1^2 & C_1^2 & & C_1^{2n-1} & B_1^{2n} & C_1^{2n} \\ B_2^1 & C_2^1 & A_2^2 & \cdots & B_2^{2n-1} & C_2^{2n-1} & A_2^{2n} \\ C_2^2 & B_2^3 & C_2^3 & & C_2^{2n} & 0 & 0 \\ & \vdots & & \ddots & & \vdots & \\ 0 & 0 & A_{2m-1}^1 & & B_{2m-1}^{2n-2} & C_{2m-1}^{2n-2} & A_{2m-1}^{2n-1} \\ C_{2m-1}^1 & B_{2m-1}^2 & C_{2m-1}^2 & & C_{2m-1}^{2n-1} & B_{2m-1}^{2n} & C_{2m-1}^{2n} \\ B_{2m}^1 & C_{2m}^1 & A_{2m}^2 & \cdots & B_{2m}^{2n-1} & C_{2m}^{2n-1} & A_{2m}^{2n} \\ C_{2m}^2 & B_{2m}^3 & C_{2m}^3 & & C_{2m}^{2n} & 0 & 0 \end{pmatrix},$$

wherein,
m and n are natural numbers, and
a first data line outputs a data signal of $(0\ B_2^1\ 0\ B_4^1\ \ldots\ 0\ B_{2m-2}^1\ 0\ B_{2m}^1)$, a second data line outputs a data signal of $(0\ C_2^1\ 0\ C_4^1\ \ldots\ C_{2m-2}^1\ 0\ C_{2m}^1)$, a next-to-last data line outputs a data signal of $(B_1^{2n}\ 0\ B_3^{2n}\ 0\ \ldots\ B_{2m-3}^{2n}\ 0\ B_{2m-1}^{2n}\ 0)$, and a last data line outputs a data signal of $(C_1^{2n}\ 0\ C_3^{2n}\ 0\ \ldots\ C_{2m-3}^{2n}\ 0\ C_{2m-1}^{2n}\ 0)$.

2. The array substrate according to claim 1, wherein:
the array substrate comprises a thin film transistor array substrate or an organic light-emitting diode array substrate.

3. The array substrate according to claim 1, wherein:
the array substrate comprises an organic light-emitting diode array substrate; and
the sub-pixels of the plurality of pixel units of the organic light-emitting diode array substrate are arranged obliquely and the sub-pixels in the same oblique line direction are of the same color.

4. The array substrate according to claim 3, wherein:
the oblique angle is 45 degrees.

5. A display device, comprising the array substrate according to claim 1.

6. An array substrate, which is a Delta-type array substrate, the array substrate comprising:
a plurality of pixel units arranged in an array, each of the plurality of pixel units comprising three triangularly-arranged sub-pixels of different colors; and
a set of data lines configured to output data signals to sub-pixels of the plurality of pixel units, each of the data lines driving the sub-pixels of the same color;
wherein the array substrate has a pixel resolution of m×n, and the set of data lines includes 3n+1 data lines, wherein data signals outputted by the 3n+1 data lines to the sub-pixels of the plurality of pixel units are respectively as below:

$$\begin{pmatrix} R_1^1 & G_1^1 & B_1^1 & R_1^2 & G_1^2 & B_1^2 & R_1^3 & & R_1^{n-1} & G_1^{n-1} & B_1^{n-1} & R_1^n & G_1^n & B_1^n & 0 \\ 0 & G_2^1 & B_2^1 & R_2^1 & G_2^2 & B_2^2 & R_2^2 & \cdots & R_2^{n-2} & G_2^{n-1} & B_2^{n-1} & R_2^{n-1} & G_2^n & B_2^n & R_2^n \\ R_3^1 & G_3^1 & B_3^1 & R_3^2 & G_3^2 & B_3^2 & R_3^3 & & R_3^{n-1} & G_3^{n-1} & B_3^{n-1} & R_3^n & G_3^n & B_3^n & 0 \\ & & & \vdots & & & & \ddots & & & & \vdots & & & \\ 0 & G_{m-2}^1 & B_{m-2}^1 & R_{m-2}^1 & G_{m-2}^2 & B_{m-2}^2 & R_{m-2}^3 & & R_{m-2}^{n-2} & G_{m-2}^{n-1} & B_{m-2}^{n-1} & R_{m-2}^n & G_{m-2}^n & B_{m-2}^n & R_{m-2}^n \\ R_{m-1}^1 & G_{m-1}^1 & B_{m-1}^1 & R_{m-1}^1 & G_{m-2}^2 & B_{m-1}^2 & R_{m-1}^3 & \cdots & R_{m-1}^{n-1} & G_{m-1}^{n-1} & B_{m-1}^{n-1} & R_{m-1}^n & G_{m-1}^n & B_{m-1}^n & 0 \\ 0 & G_m^1 & B_m^1 & R_m^2 & G_m^2 & B_m^2 & R_m^3 & & R_m^{n-2} & G_m^{n-1} & B_m^{n-1} & R_m^n & G_m^n & B_m^n & R_m^n \end{pmatrix},$$

wherein, m and n are natural numbers, and a first data line outputs a data signal of $(R_1^1\ 0\ R_3^1\ \ldots\ 0\ R_{m-1}^1\ 0)$, and a last data line outputs a data signal of $(0\ R_2^n\ 0\ \ldots\ R_{m-2}^n\ 0\ R_m^n)$.

7. The array substrate according to claim 6, wherein:

the array substrate comprises a thin film transistor array substrate or an organic light-emitting diode array substrate.

* * * * *